United States Patent [19]

Hsue et al.

[11] Patent Number: 5,698,458
[45] Date of Patent: Dec. 16, 1997

[54] MULTIPLE WELL DEVICE AND PROCESS OF MANUFACTURE

[75] Inventors: Chen-Chiu Hsue; Sun-Chieh Chien, both of Hsin-Chu; Chung-Yuan Lee, Chung-Li; Ming-Tzong Yang, Hsin Chu, all of Taiwan

[73] Assignee: United Microelectronics Corporation, Hsin-Chu, Taiwan

[21] Appl. No.: 680,101

[22] Filed: Jul. 15, 1996

Related U.S. Application Data

[63] Continuation of Ser. No. 315,773, Sep. 30, 1994, abandoned.
[51] Int. Cl.$^6$ .................................................. H01L 21/265
[52] U.S. Cl. .................................. 437/29; 437/34; 437/57
[58] Field of Search ................................ 437/26, 27, 28, 437/29, 56, 57, 34, 69, 152, 154, 150, 41 RCM; 257/369

[56] References Cited

U.S. PATENT DOCUMENTS

| | | | |
|---|---|---|---|
| 4,584,027 | 4/1986 | Metz, Jr. et al. | 148/1.5 |
| 4,697,332 | 10/1987 | Joy et al. | 437/29 |
| 4,717,683 | 1/1988 | Parrillo et al. | 437/34 |
| 4,728,619 | 3/1988 | Pfiester et al. | 437/34 |
| 4,743,563 | 5/1988 | Pfiester et al. | 437/24 |
| 4,847,213 | 7/1989 | Pfiester | 437/24 |
| 5,086,012 | 2/1992 | Sik | 437/70 |
| 5,091,324 | 2/1992 | Hsu et al. | 437/57 |
| 5,091,332 | 2/1992 | Bohr et al. | 437/34 |
| 5,384,279 | 1/1995 | Stolmeijer et al. | 437/57 |
| 5,393,677 | 2/1995 | Lien et al. | 437/34 |
| 5,393,679 | 2/1995 | Yang | 437/57 |
| 5,413,944 | 5/1995 | Lee | 437/56 |
| 5,416,038 | 5/1995 | Hsue et al. | 437/57 |
| 5,432,114 | 7/1995 | O | 437/56 |
| 5,434,099 | 7/1995 | Hsue | 437/57 |
| 5,455,188 | 10/1995 | Yang | 437/30 |
| 5,475,761 | 12/1995 | Komori et al. | 437/34 |
| 5,478,761 | 12/1995 | Komori et al. | 437/34 |
| 5,484,742 | 1/1996 | Urai | 437/44 |
| 5,494,843 | 2/1996 | Huang | 437/56 |

FOREIGN PATENT DOCUMENTS

58-17656  2/1983  Japan .................................. 437/57

*Primary Examiner*—John Niebling
*Assistant Examiner*—S. Mulpuri
*Attorney, Agent, or Firm*—William H. Wright

[57] ABSTRACT

A method of manufacture of a semiconductor device comprises forming a silicon dioxide film upon the surface of said device, forming patterns of silicon nitride upon the surface of said silicon dioxide film, ion implanting ions into said substrate adjacent to at least some of said silicon nitride patterns for well regions of a first polarity, forming a mask over said device, and deeply ion implanting with ions of opposite polarity into well regions of opposite polarity.

1 Claim, 10 Drawing Sheets

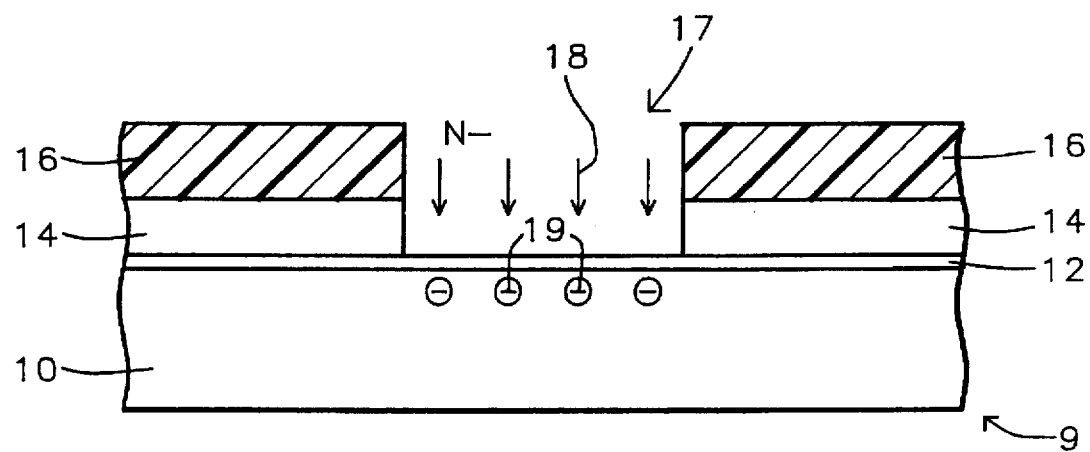
FIG. 1A – Prior Art
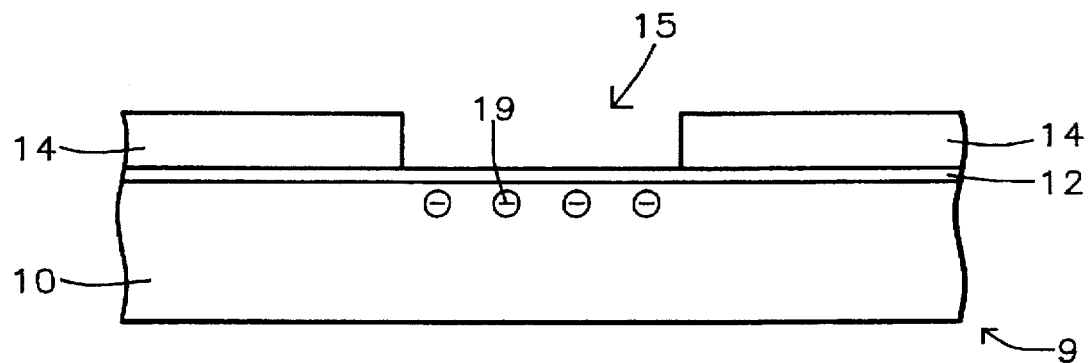
FIG. 1B – Prior Art
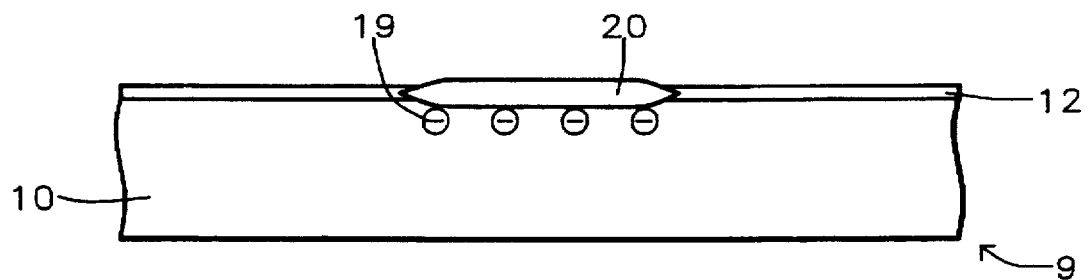
FIG. 1C – Prior Art

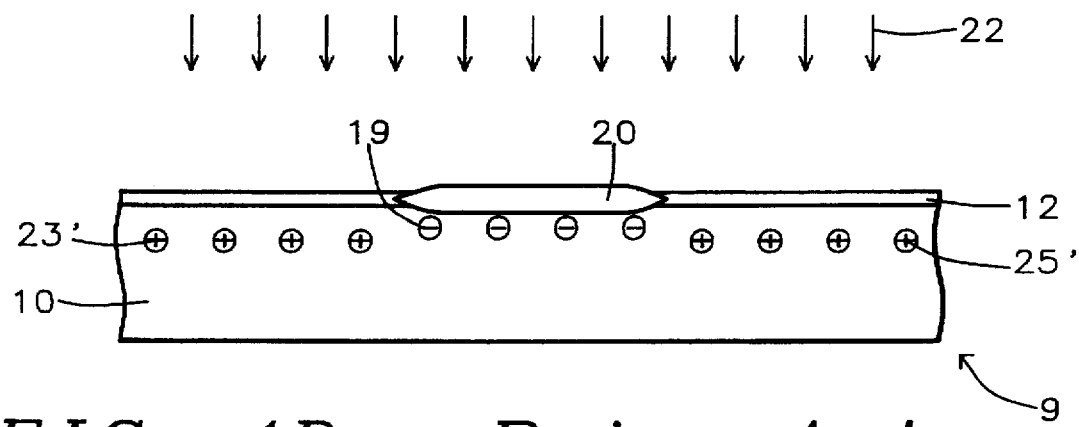
FIG. 1D – Prior Art
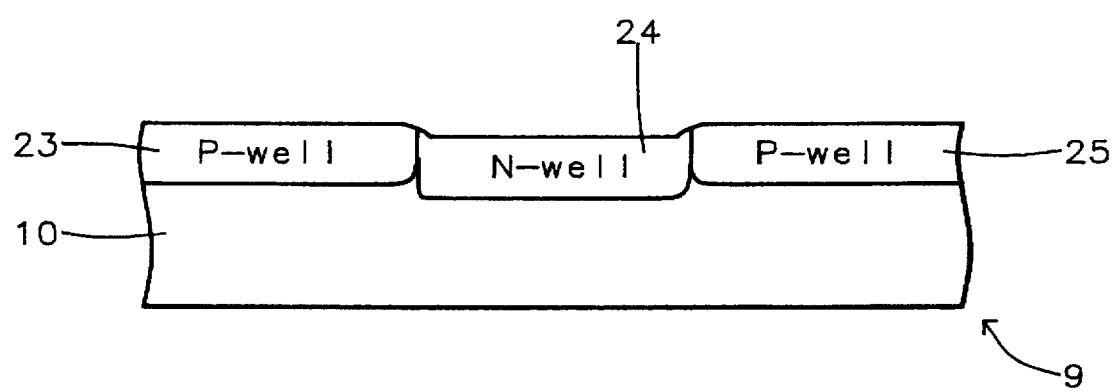
FIG. 1E – Prior Art
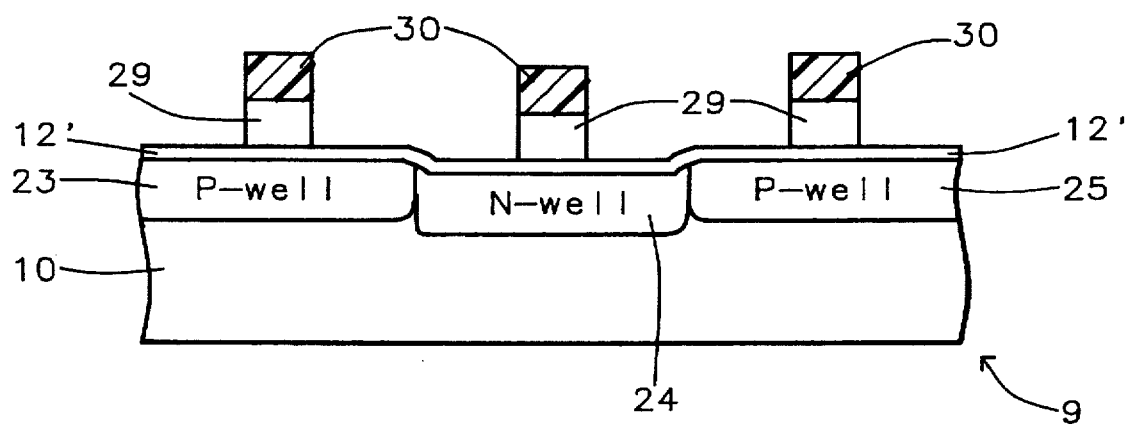
FIG. 1F – Prior Art

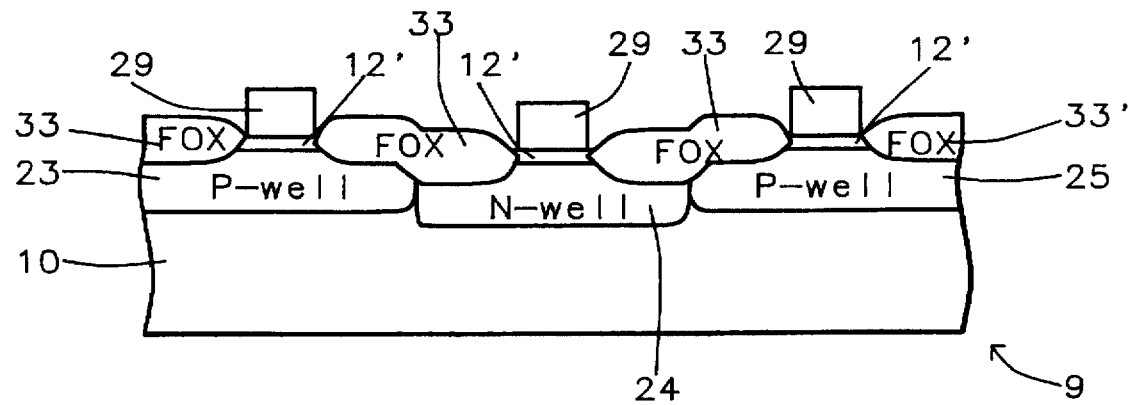
FIG. 1G – Prior Art
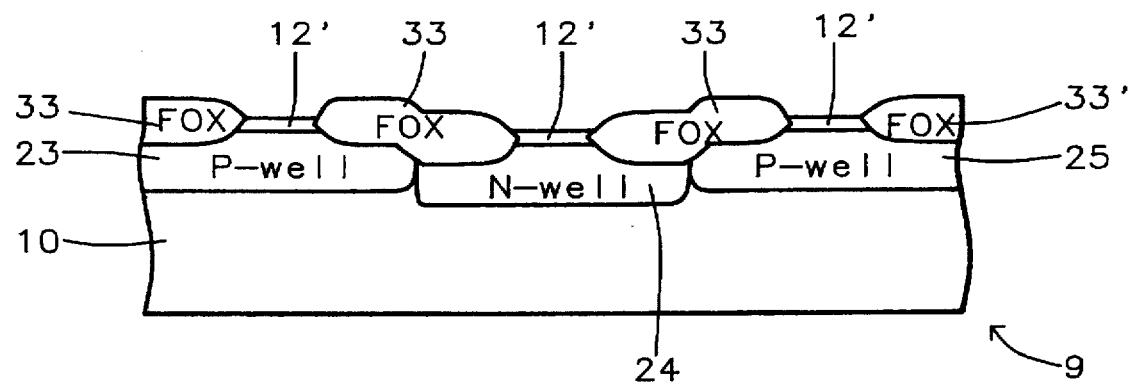
FIG. 1H – Prior Art

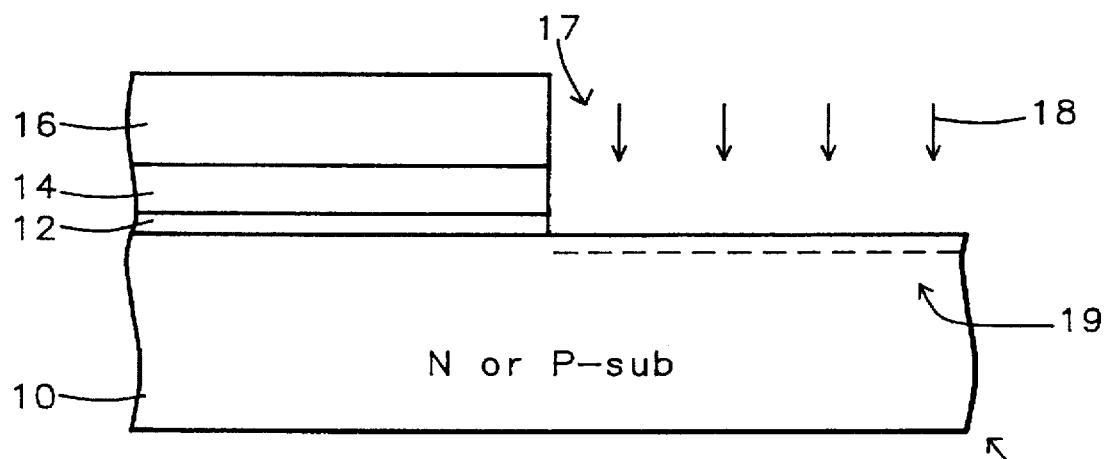
FIG. 3A – Prior Art
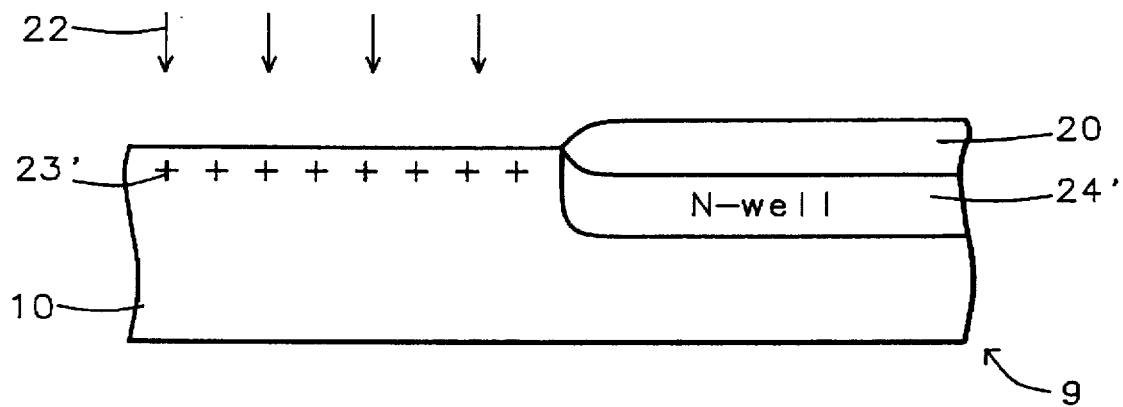
FIG. 3B – Prior Art
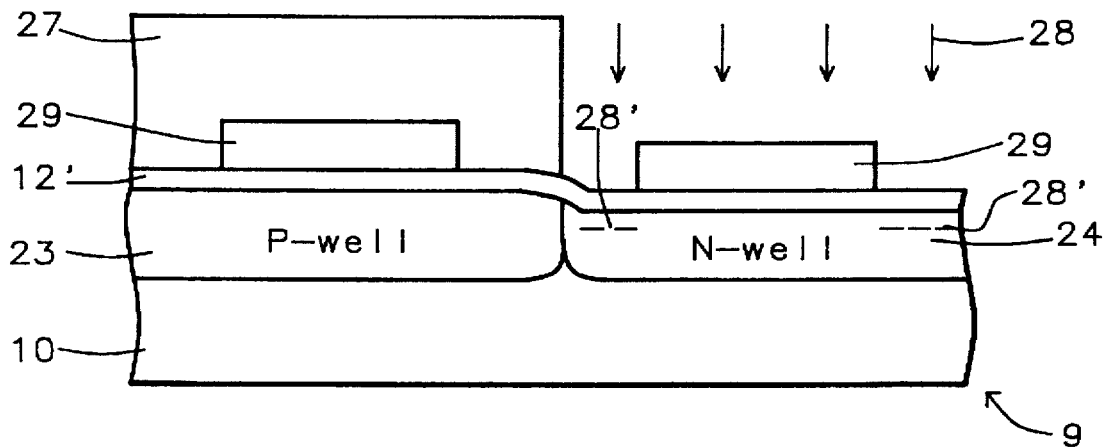
FIG. 3C – Prior Art

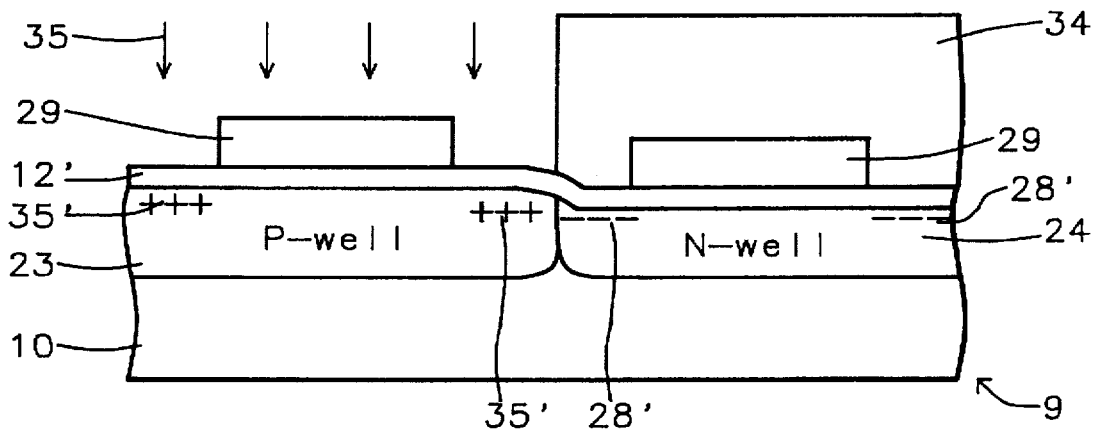
FIG. 3D – Prior Art
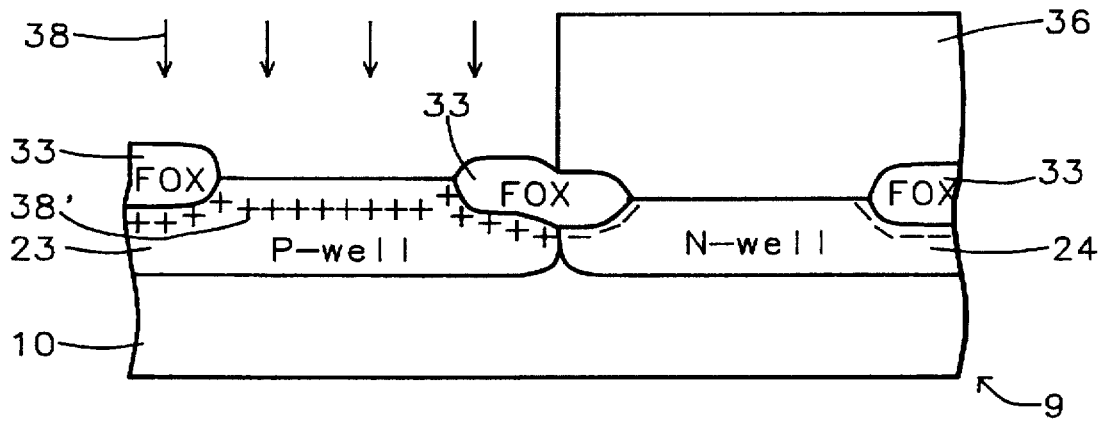
FIG. 3E – Prior Art
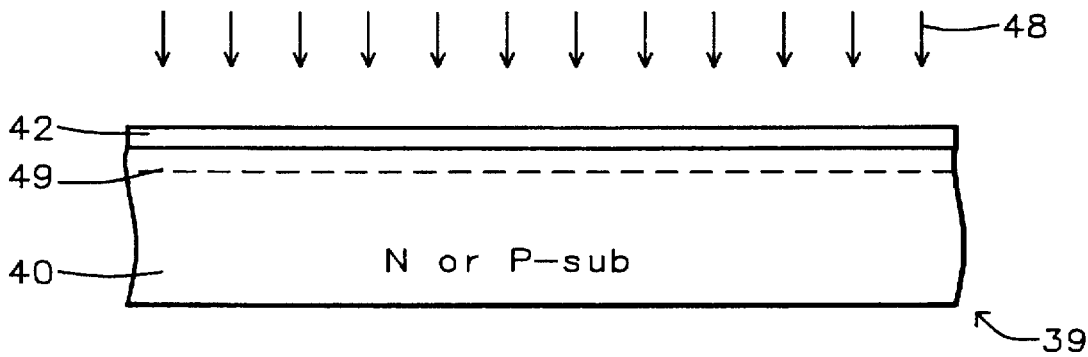
FIG. 4A

MULTIPLE WELL DEVICE AND PROCESS OF MANUFACTURE

This is a continuation of application Ser. No. 08/315,773 filed on Sep. 30, 1994, now abandoned.

BACKGROUND OF THE INVENTION

1. Field of the Invention

This invention relates to MOSFET devices and more particularly to improve manufacture thereof.

2. Description of Related Art

In the manufacture of twin well devices, silicon nitride has been used in a local oxidation process. The disadvantage of such processes which use silicon nitride for that purpose is that the process is complicated and that a great number of processing steps is required and an excessive process cycle time is required.

FIGS. 1A–1G show steps of a prior art process. FIG. 1A shows the starting material is a semiconductor device 9 with a doped silicon N-substrate or P-substrate 10.

Then a PAD oxide layer 12 is formed on the doped semiconductor substrate 10 by a process which forms silicon dioxide ($SiO_2$) on the surface of the semiconductor substrate 10 by thermal oxidation.

Next a silicon nitride ($Si_3N_4$) layer 14 is deposited by the process of LPCVD (Low Pressure Chemical Vapor Deposition) in a reaction employing ammonia ($NH_3$) and dichlorosilane ($SiCl_2H_2$) with parameters including a thickness of about 1,000 Å, a temperature within a range from about 750° C. to about 800° C.

A photoresist mask 16 is formed by conventional photolithography with an opening 17 formed over the area in which an N-well 24 is to be formed as shown in FIG. 1E.

Application of $P^{31}$ ions through opening 17 into region 19 of substrate 10 for N-well ion implantation follows.

FIG. 1B shows the prior art device of FIG. 1A after photoresist mask 16 is removed.

FIG. 1C shows the prior art device of FIG. 1B after an N-well oxidation is performed through the silicon nitride mask layer 14 forming the N-well oxide region 20 in place of the Pad oxide layer 12 in the region above the region where N-well 24 is to be formed from ions 19 in FIG. 1E.

Then the silicon nitride mask layer 14 is removed.

FIG. 1D shows the prior art device of FIG. 1C after ion implanting $BF_2$ or $B^{11}$ ions 23 to prepare to form a P-well. The N-well oxide region 20 serves as a barrier over the dopant 19 which will form N-well 24.

FIG. 1E shows the product of FIG. 1D after the region 19 and regions 23' and 25' have been subjected to drive in of dopant forming the P-wells 23 and 25 and the N-well 24.

Then the N-well oxide region 20 and the Pad oxide layer 12 are removed by an aqueous etching solution (i.e. 10:1 HF hydrofluoric acid in $H_2O$.)

FIG. 1F shows the prior art device of FIG. 1E after a silicon dioxide base layer 12' is formed over the P-wells 23 and 25 and the N-well 24.

Next, a layer 29 of silicon nitride $Si_3N_4$ is formed on the silicon dioxide layer 28, which in turn is covered with a photoresist mask 30 which is patterned in a conventional "mask alignment photolithography process" including application of photoresist photolithographically. First the device is coated with a blanket of unexposed photoresist. Then the device with the unexposed resist is aligned in an active mask alignment process. Then the photoresist is photolithographically exposed to the pattern and then the photoresist is developed to form a photoresist mask 30. Then the silicon nitride layer 29 is etched through the photoresist mask 30, as shown leaving the surface of the silicon dioxide base layer 12' exposed between the remaining silicon nitride mask 29.

In FIG. 1G, the product of FIG. 1F is shown after the photoresist mask 30 has been removed leaving the silicon nitride mask 29 remaining.

Then the surface of the silicon dioxide base layer 12' exposed between the remaining silicon nitride mask 29 regions is subjected to a conventional field oxidation process yielding the field oxide (FOX) regions 33 over the junctions between the P-wells 23/25 and N-well 24 a furnace temperature within a range from 900° C. to 1100° C., with $O_2/H_2$ to form a field oxide layer having a thickness within a range from 4,000 Å to 9,000 Å.

Referring to FIG. 1H, the silicon nitride mask 29 has been removed by the process of wet etching in an aqueous solution of $H_3PO_4$ within a temperature range from 150° C. to 170° C. for a period of time from 60 minutes to 90 minutes. As a result of this etching step, the surface of the silicon dioxide base layer 12' exposed where the silicon nitride mask 29 is removed.

FIGS. 3A–3D illustrate a prior art twin well process.

Referring to FIG. 3A, in accordance with that twin well process, the starting material is a semiconductor device 9 with a doped silicon N- or P-substrate 10.

Then a PAD oxide layer 12 is formed on the doped semiconductor substrate 10 by a process (forming silicon dioxide to the surface of the semiconductor) of thermal oxidation.

Next silicon nitride layer 14 is deposited by the process of LPCVD in a reaction employing ammonia ($NH_3$) and dichlorosilane ($SiCl_2H_2$) with parameters including a thickness of from 1,000 Å to 2,000 Å and a temperature within a range from about 750° C. to about 800° C.

A photoresist mask 16 is formed by conventional photolithography with an opening 17 formed over the area in which an N-well 24 is to be formed in FIG. 3E by etching away the silicon nitride layer 14 below the opening 17.

Next follows a step of application of an N-well ion implantation of $P^{31}$ ions 18 through opening 17 into region 19 of substrate 10 follows. Then the photoresist mask 16 is removed.

Referring to FIG. 3B the prior art product of the process of FIG. 3A is shown with an N-well oxide layer 20 is formed by an N-well oxidation through the silicon nitride mask layer 14 forming the N-well oxide region 20 in substrate 10 above the N-well region 24' where N-well 24 is to be formed in region 19 in FIG. 3C. Then the silicon nitride mask 14 is removed.

Next, a P-well implant is performed to prepare to form a P-well by means of ion implanting $BF_2$ or $B^{11}$ ions 22 into region 23'. The N-well oxide region 20 serves as a barrier.

FIG. 3C shows the prior art product of the process of FIG. 3B after the region 19 and the regions 23 have been subjected to drive in of dopant forming the P-well 23 and the N-well 24, converting region 24' into N-well 24, converting region 23' into P-well 23. Then the N-well oxide is removed by wet etching in an aqueous solution of 10:1 hydrofluoric acid (HF).

Then a new pad oxide layer 12' is formed by thermal oxidation.

A silicon nitride layer 29 is deposited, patterned with an active mask (not shown.) The silicon nitride layer 29 is etched away through that mask to form the pattern shown. Then that photoresist mask is removed.

Then an N- field photoresist mask 27 is formed over the P-well 23.

Then the an arsenic N- field implant of ions 28 into N-well 24 is performed forming dopant regions 28' on either side of mask 29 in N-well 24.

FIG. 3D shows the prior art product of the process of FIG. 3C after mask 27 has been removed.

Then a P- field mask photoresist mask 34 is formed over the N-well 24.

Then the a $BF_2$ or $B^{11}$ P- field implant of ions 35 into P-well 23 is performed providing doped regions 35' on either side of mask 29.

FIG. 3E shows the prior art product of the process of FIG. 3C after the photoresist mask 34 has been removed. Using a field oxidation process, the pad oxide layer 12' is converted into field oxide regions 33 above doped regions 28' and 35' in FIG. 3D.

Next, the silicon nitride mask 29 is removed by the process of wet etching in an aqueous solution of $H_3PO_4$ within a temperature range from 150° C. to 170° C., and the remainder of the pad oxide layer 12' has been removed by wet etching in an aqueous solution of 10:1 hydrofluoric acid (HF).

Next, VPTN mask 36 is applied and an ion implant of $B^{11}$ ions 38 is applied into the space between FOX regions 33 over the P-well 23 leaving + ions 38' near the surface of P-well 23.

VPTN Implant

Subsequently, the well is driven in and a field oxidation process is performed.

Next, the P-well is masked.

Following that, a deep P- field implant of $B^{11}$ at between about 150 keV and about 200 keV is performed.

Then, N-MOS anti-punchthrough ion implantation of $B^{11}$ is performed.

That process involves five masking steps, five ion implantation steps and seven thermal cycles.

U.S. Pat. No. 5,086,012 of Sik, U.S. Pat. No. 4,847,213 of Pfiester, U.S. Pat. No. 4,743,563 of Pfiester, U.S. Pat. No. 4,728,619 Pfiester and U.S. Pat. No. 4,717,683 Parnella show twin-well processes.

SUMMARY OF THE INVENTION

An object of this invention is to provide a twin well device with a reduced number of process steps and reduced process cycle time.

In addition it is an object of reducing masking steps and thermal cycles.

Further it is desired to reduce cost and improve yield.

In accordance with this invention, a method is provided for fabrication of a semiconductor device on a substrate comprising forming a silicon dioxide film on the substrate,
forming and patterning a silicon nitride layer on the silicon dioxide film,
ion implanting impurities through the silicon nitride layer and the silicon dioxide layer for well regions of a first conductivity type,
ion implanting impurities through the silicon nitride layer and the silicon dioxide film for well regions of a second conductivity type.

Preferably, the ion implantation for the first conductivity type of well comprises an N-well implantation process;
the ion implantation of the N- well comprises $P^{31}$ ions at an energy greater than about 320 KeV;
the ion implantation for the second conductivity type of well comprises a P-well implantation process;
the ion implantation of the P- well comprises $B^{11}$ ions at an energy greater than about 320 KeV;
subsequent to forming the silicon nitride layer upon the surface of the silicon dioxide film,
forming a mask over one portion of the device leaving the other portion of the device exposed,
performing an ion implantation for one conductivity type of well into the other portion of the device;
the first conductivity type region is a P-well and the second conductivity type region is an N-well.

In accordance with another aspect of this invention, a method of fabrication of a semiconductor device on a substrate comprises forming a silicon dioxide film on the substrate,
ion implanting impurities of a first conductivity type through the silicon dioxide layer into the substrate for well regions of a first conductivity type,
forming and patterning a silicon nitride layer on the silicon dioxide film,
ion implanting impurities through the silicon nitride layer and the silicon dioxide film for well regions of a second conductivity type.

Preferably, the ion implantation for the first conductivity type of well comprises a maskless N-well implantation process;
the ion implantation of the N-well comprises $P^{31}$ ions at an energy greater than about 50 KeV;
the ion implantation for the second conductivity type of well comprises a P-well implantation process;
the ion implantation of the P-well comprises $B^{11}$ ions at an energy greater than about 150 KeV;
subsequent to forming the silicon nitride layer upon the surface of the silicon dioxide film,
forming a mask over one portion of the device leaving the other portion of the device exposed,
performing an ion implantation for one conductivity type of well into the other portion of the device.

Preferably, the first conductivity type region is a P-well and the second conductivity type region is an N-well;
the ion implantation dose of the second conductivity type is larger than the dose of the first conductivity type.

BRIEF DESCRIPTION OF THE DRAWINGS

The foregoing and other aspects and advantages of this invention are explained and described below with reference to the accompanying drawings, in which:

FIGS. 1A–1H show steps of a prior art process.

FIGS. 3A–3E illustrate steps of a prior art twin well process.

FIGS. 4A to 4E show steps of a process in accordance with this invention.

DESCRIPTION OF THE PREFERRED EMBODIMENT

CMOS Twin-Well Process

FIGS. 2A–2G show steps of a process in accordance with this invention.

Figure 2A:
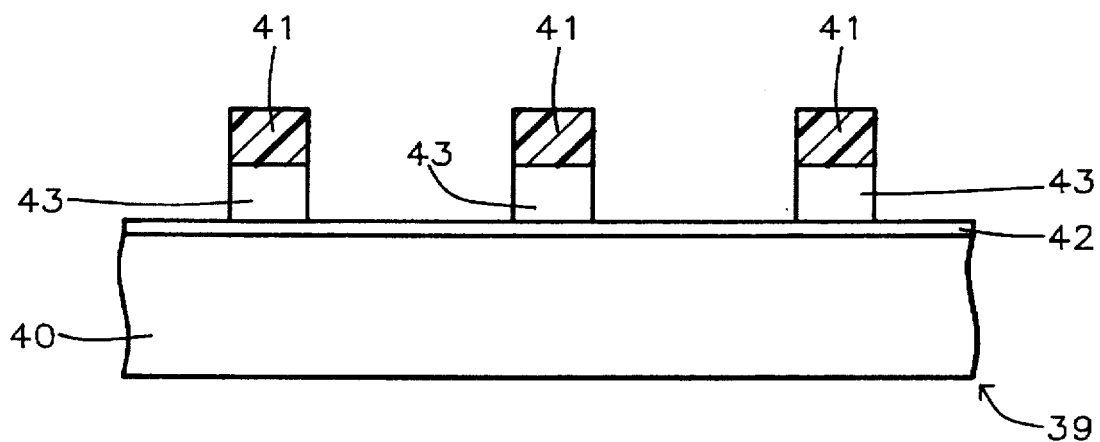
FIGS. 2A–2H show steps of a process in accordance with this invention.

In FIG. 2A a device 39 comprising a silicon semiconductor doped N- or P-substrate 40 has a base silicon dioxide (SiO$_2$) layer 42 is formed on the doped semiconductor substrate 40 by a process (preferably forming silicon dioxide on the surface of the doped silicon semiconductor) of thermal oxidation.

Next a blanket silicon nitride (Si$_3$N$_4$) layer 43 is deposited by the process of LPCVD (Low Pressure Chemical Vapor Deposition) in a reaction employing ammonia (NH$_3$) and dichlorosilane (SiCl$_2$H$_2$) with parameters including a thickness of from 1,000 Å to 2,000 Å, at a temperature within a range from about 750° C. to about 800° C.

Then the silicon nitride layer 43 was patterned into the form shown in FIG. 2A. Initially, a photoresist layer 41 is applied. Then the device coated with the unexposed photoresist layer 41 is aligned in a mask alignment process, exposed and patterned photolithographically to form mask 41. Mask 41 is then used during etching of the silicon nitride layer 43 to form the silicon nitride segmented mask structures 43 shown in FIG. 2A. After that step, the preliminary photoresist mask 41 has been removed.

Figure 2B:
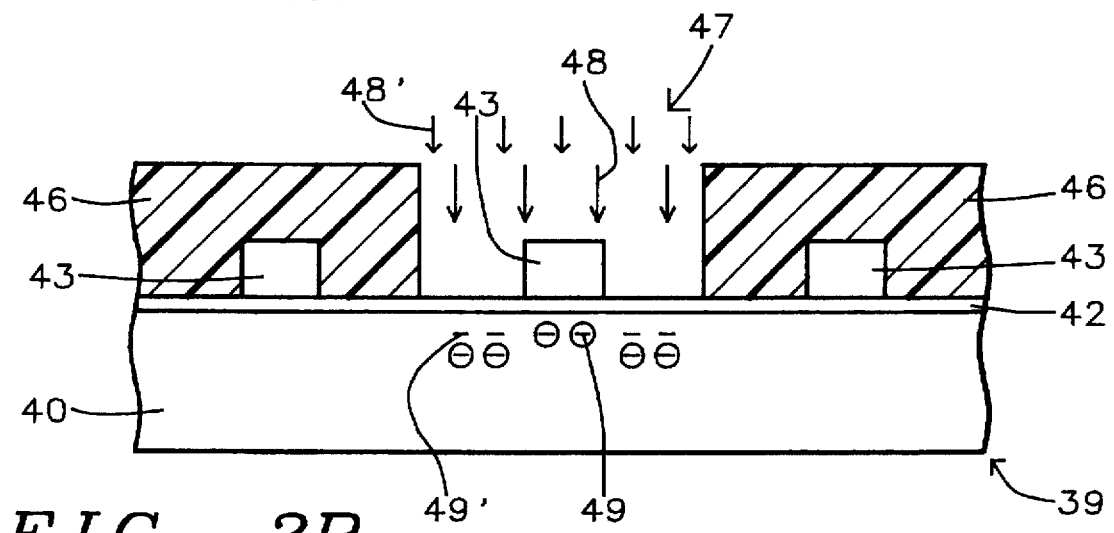

FIG. 2B shows an N-well photoresist mask 46 formed by a conventional photolithography process including application of photoresist which is then photolithographically patterned. Then the device coated with the unexposed resist is aligned in a mask alignment process. The mask 46 provides an opening 47 formed over the area in which an N-well 54 is to be formed in FIG. 2E.

Next follows application of an N-well ion implantation of P$^{31}$ ions at an energy greater than about 320 keV forming P+ region 49 through opening 47, by ion implanting into region 49 of substrate 40.

Dopant P$^{31}$ ions 48 are implanted through the opening 47 into zone 49 of substrate 40. The dopant is applied at a preferred dose of 1×E13 cm$^{-2}$ of P$^{31}$ at an energy greater than about 320 keV. A range of energies from approximately 320 keV to approximately 500 keV is possible. A range of doses from approximately 5×E12 cm$^{-2}$ to approximately 5×E13 cm$^{-2}$ is possible.

FIG. 2B shows the device of FIG. 2A after the N-well implant to prepare to form a P-well by means of ion implanting ions 23.

At this point, an N-field implant by As+ 48' is optional. The N- implant 48' can also be implanted through the opening 47 into zone 49' of substrate 40 to improve to N-field isolation capability.

Figure 2C:
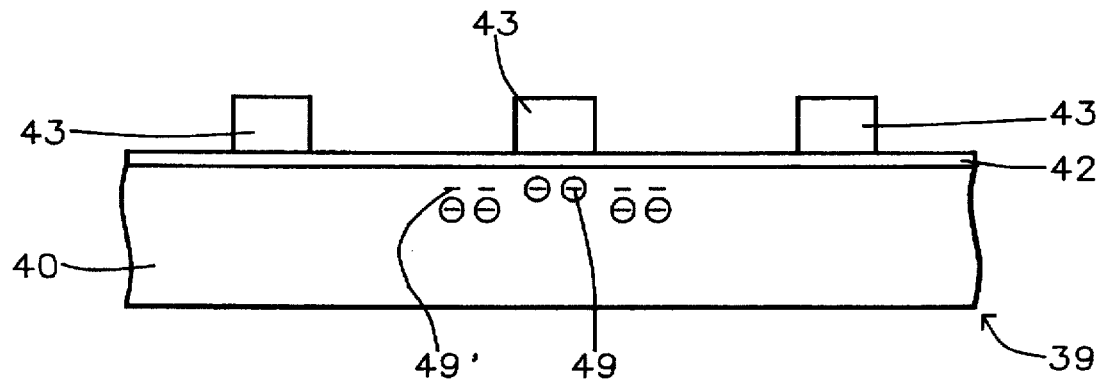

FIG. 2C shows the product of FIG. 2B after the photoresist mask 46 was removed.

Figure 2D:
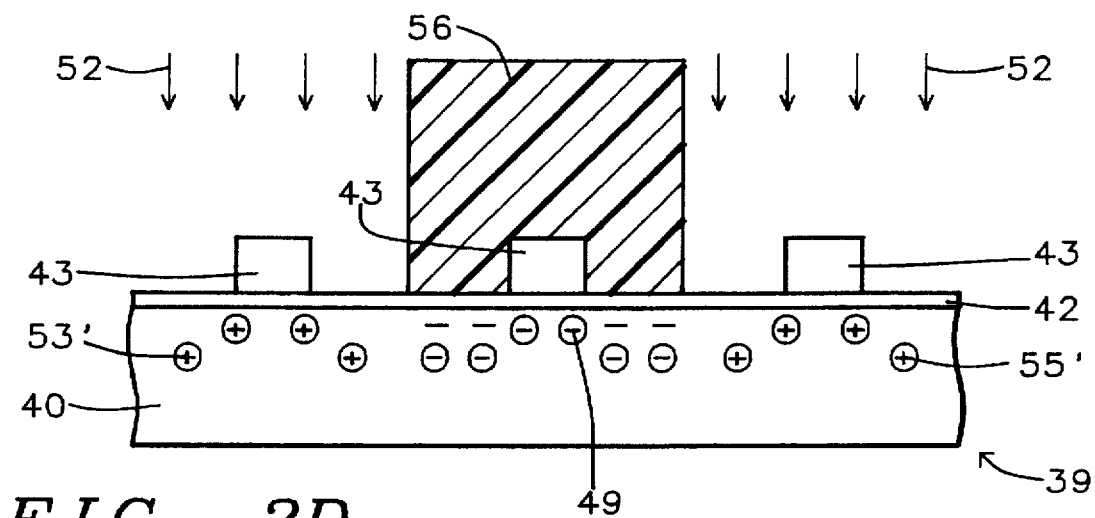

In FIG. 2D shows an P-well photoresist mask 56 is formed by a conventional mask alignment photolithography process including application of photoresist which is then patterned photolithographically. Then the device coated with the unexposed resist is aligned in the P-well mask alignment process. The mask 56 protects the N-well region 49. In a P-well implant, B$^{11}$ dopant ions 52 are implanted through the silicon dioxide layer 42 into zones 53' and 55' of substrate 40. The dopant 52 is applied at a preferred dose of 7×E12 cm$^{-2}$ of B$^{11}$ at a preferred energy of greater than about 150 keV. A range of energies from approximately 150 keV to approximately 300 keV is possible. A range of doses from approximately 3×E12 cm$^{-2}$ to approximately 1×E14 cm$^{-2}$ is possible.

Figure 2E:
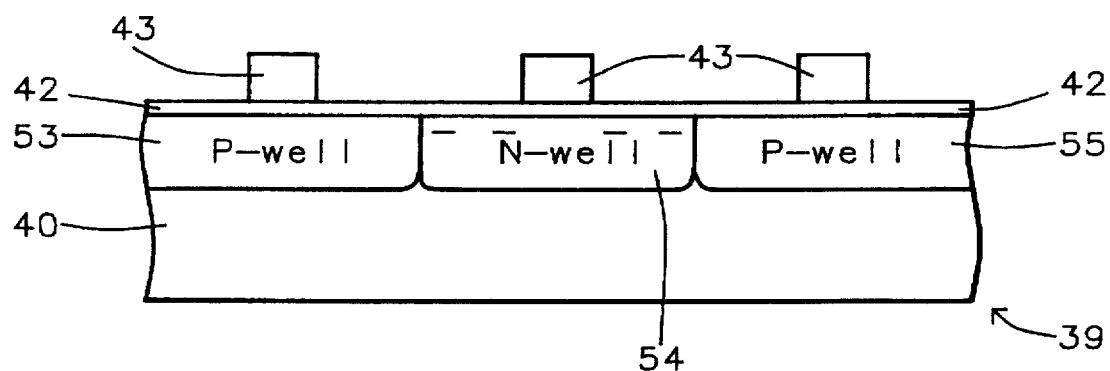

FIG. 2E shows the product of FIG. 2D after the photoresist 56 has been removed. Then a P-well and N-well drive-in process is performed. Ions in region 49 form N-well 54. Ions in regions 53' and 55' have been subjected to drive in of dopant forming the P-wells 53 and 55.

Figure 2F:
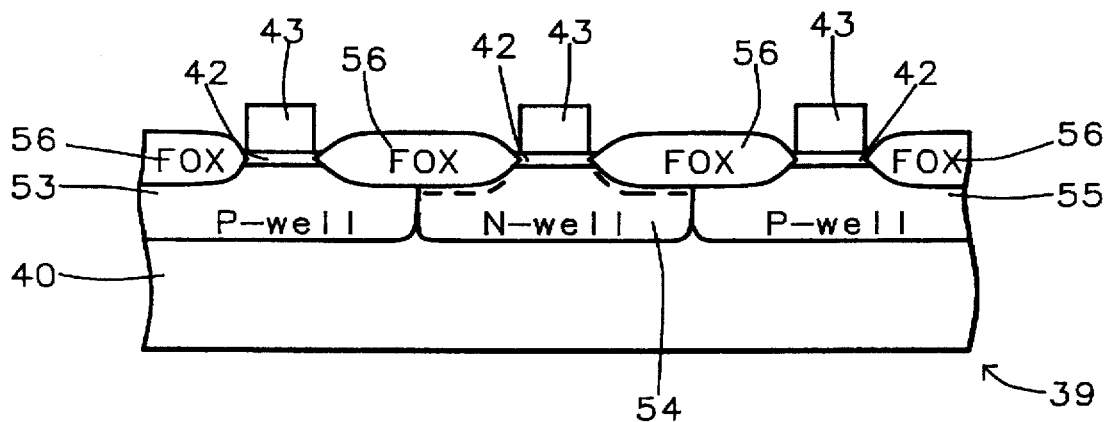

FIG. 2F shows the device of FIG. 2E after a field oxidation process in which the silicon dioxide (SiO$_2$) layer 42 which is exposed between the remaining silicon nitride mask 29 regions is subjected to a conventional field oxidation process yielding the field oxide (FOX) regions 56 over the junctions between the P-wells 53/55 and N-well 54, etc. The process used to form the field oxide regions 56 is a conventional thermal oxidation process performed for from 2 hours to 10 hours a furnace temperature within a range from 900° C. to 1100° C., with H$_2$/O$_2$ gas to form a field oxide layer 56.

Again referring to FIG. 2F, the silicon nitride mask 43 has been removed by the process of wet chemical etching in an aqueous solution of H$_3$PO$_4$ within a temperature range from 150° C. to 170° C. for a period of time from 30 minutes to 90 minutes, leaving the surface of the silicon dioxide base layer 42 exposed where the silicon nitride mask 43 is removed.

Figure 2G:
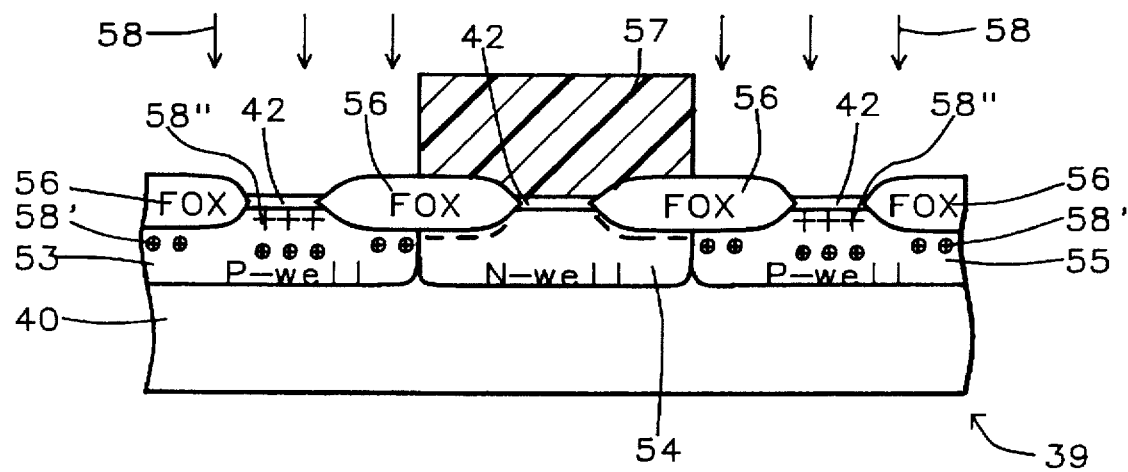

In FIG. 2G, the product of FIG. 2F is shown after mask 43 was removed. The P-field masking process follows in which a conventional "mask alignment photolithography process" is performed including application of photoresist mask 57. First the device is coated with a blanket of unexposed photoresist. Then the device with the unexposed resist is aligned in an P-field mask alignment process. Then the photoresist is photolithographically exposed to the pattern and then the photoresist is developed to form a photoresist mask 57.

Next in a P-field implanting process, P-dopant B$^{11}$ ions 58 are implanted, where photoresist mask 57 is absent, into P-field implant regions 58' through field oxide FOX regions 56 and through SiO$_2$ base layer 42 into the P-wells 53 and 55 wherever the mask 57 is absent. The dopant is applied at a preferred dose of 8×E12 cm$^{-2}$ of B$^{11}$ at a preferred energy of 180 keV to provide a far higher level of doping than in the remainder of P-well 53. A range of energies from approximately 150 keV to approximately 200 keV is possible. A range of doses from approximately 5×E12 cm$^{-2}$ to approximately 5×E13 cm$^{-2}$ is possible.

At this point, an additional NMOS anti-punchthrough implant 58 by boron B+ is an option. The NMOS anti-punchthrough implant can be implanted through the base oxide 42 where field oxide and photoresist mask are absent, see region 58".

Figure 2H:
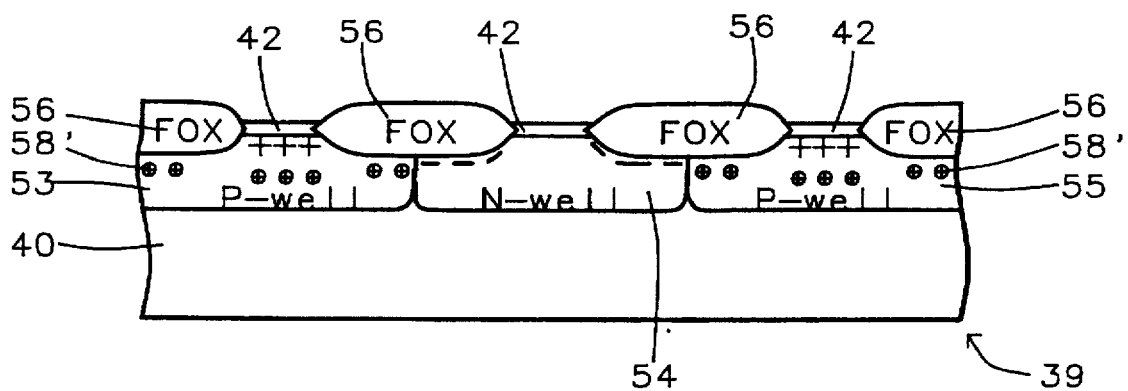

In FIG. 2H, the product of FIG. 2G is shown after the photoresist 57 is removed.

Figure 4B:
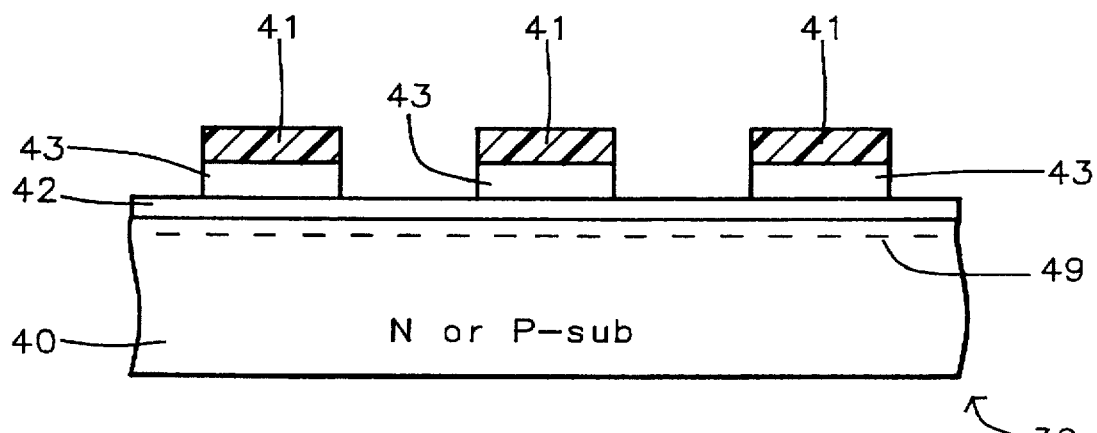

FIGS. 4A to 4E show another process in accordance with this invention. In accordance with a prior art process, as shown by FIG. 4A the starting material for manufacture of a device 39 is a semiconductor doped N- or P-substrate 40.

Then on the doped semiconductor substrate 40, a base oxide layer 42 is formed by a process (preferably forming silicon dioxide on the surface of the doped silicon semiconductor) thermal oxidation process with performed at a furnace temperature within a range from 900° C. to 1000° C., with N$_2$/O$_2$ gas with a thickness of from 100 Å to 400 Å.

Next follows a blanket application of an N-well ion implantation of P$^{31}$ ions 48 at an energy greater than about 50 keV forming P+ region 49 through the layer 42, by ion implanting into a blanket region 49 within substrate 40 and near the surface thereof.

Dopant P$^{31}$ ions 48 are implanted through the into zone 49 of substrate 40. The dopant 48 is applied at a preferred dose of 1×E13 cm$^{-2}$ of P$^{31}$ at an energy greater than about 50 keV. A range of energies from approximately 50 keV to approximately 150 keV is possible. A range of doses from approximately 5×E12 cm$^{-2}$ to approximately 5×E13 cm$^{-2}$ is possible.

FIG. 4B shows the device of FIG. 4A after deposition of a blanket silicon nitride (Si$_3$N$_4$) layer 43 deposited by the process of LPCVD (Low Pressure Chemical Vapor Deposition) in a reaction employing ammonia (NH$_3$) and dichlorosilane (SiCl$_2$H$_2$) with parameters including a thickness of from 1,000 Å to 2,000 Å at a temperature within a range from about 750° C. to about 800° C. and after formation of silicon nitride mask structures 43.

After silicon nitride layer 43 is deposited, a photoresist layer 41 is applied. Then the device coated with the unexposed photoresist layer 41 is aligned in a mask alignment process, exposed and patterned photolithographically to form mask 41. Mask 41 is then used during etching of the silicon nitride layer 43 to form the silicon nitride segmented mask structures 43 shown in FIG. 4C. After that step, the preliminary photoresist mask 41 has been removed and the arsenic N- field implant of ions 62 is performed in regions 63 through the spaces between segments of silicon nitride mask structures 43. This N-field implant is optional.

Figure 4C:
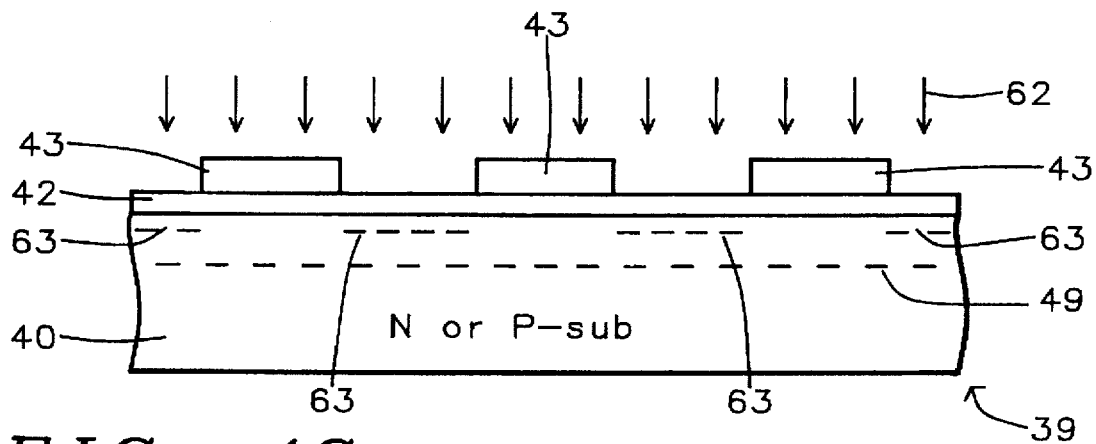
Figure 4D:
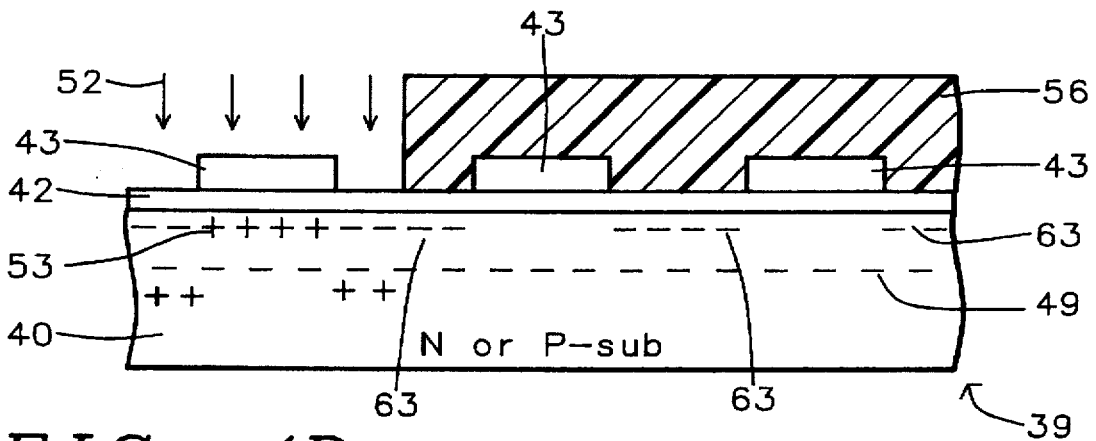
Figure 4E:
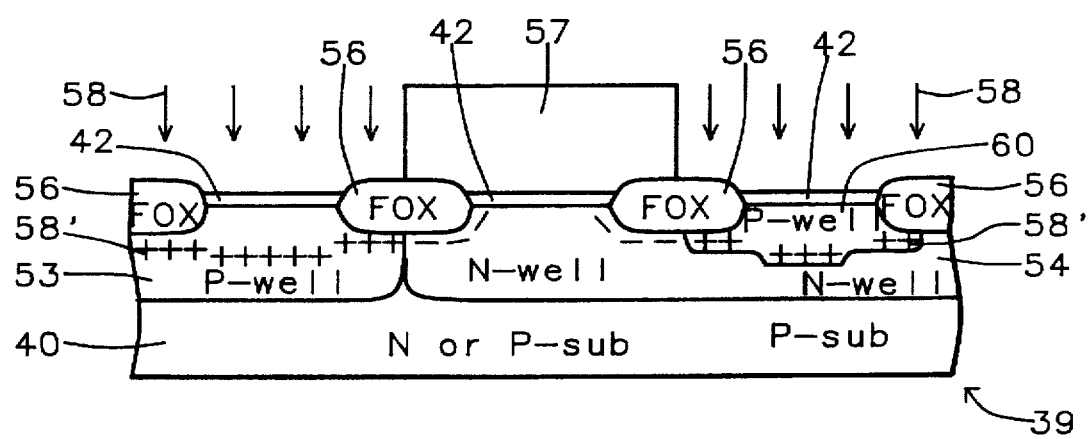

In FIG. 4D the device 39 of FIG. 4C is shown after a photoresist mask 56 has been formed which protects the area in which an N-well 54 is to be formed in FIG. 4E. A P-well photoresist mask layer 56 is formed by a conventional mask alignment photolithography process including application of photoresist layer 56 which is then patterned photolithographically. Then the device 39 coated with the unexposed resist is aligned in the P-well mask alignment process. The mask 56 protects the N-well region 49. In a P-well implant, B$^{11}$ dopant ions 52 are implanted through the nitride layer 43 and oxide layer 42 into zones 53 of substrate 40. The dopant 52 is applied at a preferred dose of 7×E12 cm$^{-2}$ of B$^{11}$ at a preferred energy of greater than about 150 keV. A range of energies from approximately 150 keV to approximately 300 keV is possible. A range of doses from approximately 3×E12 cm$^{-2}$ to approximately 1×E14 cm$^{-2}$ is possible.

FIG. 4E shows the product of FIG. 4D after the photoresist mask 56 has been removed.

Then a P-well and N-well drive-in process is performed. Ions in region 49 form N-well 54. Ions in regions 53 have been subjected to drive in of dopant forming the P-well 53.

Then a field oxidation process in which the silicon dioxide layer 42 is exposed between the remaining silicon nitride mask 29 regions is subjected to a conventional field oxidation process yielding the field oxide (FOX) regions 56 over the junctions between the P-wells 53 and N-well 54, etc. The process used to form the field oxide regions 56 is conventional thermal oxidation. The process employs uses O$_2$/H$_2$ gas and operates at a temperature within a range from 900° C. to 1100° C. for from 2 hours to 10 hours to form field oxide regions 56 having a thickness within a range from 4,000 Å to 10,000 Å.

Then silicon nitride 43 layer has been removed leaving exposed the portions of the silicon dioxide layer 42 not covered by FOX regions 56. The silicon nitride mask 43 was removed by the process of wet chemical etching in an aqueous solution of H$_3$PO$_4$ within a temperature range from 150° C. to 170° C. for a period of time from 30 minutes to 90 minutes, leaving the surface of the silicon dioxide base layer 42 exposed where the silicon nitride mask 43 is removed.

The P-well masking process follows in which a conventional "mask alignment photolithography process" is performed including application of photoresist mask 57. First the device is coated with a blanket of unexposed photoresist. Then the device with the unexposed resist is aligned in an P-well mask alignment process. Then the photoresist is photolithographically exposed to the pattern and then the photoresist is developed to form a photoresist mask 57.

Next in a deep P-well implanting process (which is similar to the P-field implant shown in FIGS. 2G and 2H) P-dopant of B$^{11}$ ions 58 is implanted, where photoresist mask 57 is absent, into the P-wells 53 and 60. Dopant ions 58' are implanted through base layer 42 and FOX regions 56 into regions 58' in P-wells 53 AND 60. A preferred range of depths of the P-well implant in region 53 is from approximately 4,000 Å to approximately 6,000 Å. This is the same as the P-field implant of FIGS. 2G/2H deeply implanted through the field oxide. The P- field implant depth in the prior art is 300 Å to about 1500 Å in which it is necessary to avoid implant through silicon nitride into the active area.

The dopant is applied at a preferred dose of 8×E12 cm$^{-2}$ of B$^{11}$ at a preferred energy of 180 keV to provide a far higher level of doping than in the remainder of P-well 53. A range of energies from approximately 150 keV to approximately 200 keV is possible. A range of doses from approximately 5×E12 cm$^{-2}$ to approximately 5×E13 cm$^{-2}$ is possible.

Subsequently, the photoresist 57 is removed.

The shallow embedded P-well 60 in N-well 54 is adapted to forming an SRAM cell. The shallower P-well as compared to a separate P-well will result in an improved soft THAN error immunity. This shallow P-well is an optional feature in accordance with this invention.

SUMMARY

The process flow of this invention is greatly simplified compared with the prior art. Process cycle time can be reduced because several steps for a conventional well can be removed. The planarization is superior to that found in the conventional well.

CMOS Twin-Well Process

The N-well oxidation of FIG. 1C can be removed. The channel stop implant (N-field implant) can be implemented without any extra masking steps as in FIG. 2B.

Special Process Description

1. N-well implant must be made through the nitride layer. Accordingly the dopant is implanted with a higher energy than employed heretofore.

EXAMPLE 1

For dopant P$^{31}$ energy>360 keV

2. P-well implant must be made through the nitride layer. Accordingly the dopant is implanted with a higher energy than employed heretofore.

EXAMPLE 2

For dopant B$^{11}$ energy>180 keV.

Self-Aligned Twin-Well Process

The process of FIGS. 4A–4D involves only three masking steps, five ion implantation steps and three thermal cycles.

For forming the third shallow P-well in the N-well, an extra mask and implant is required to adjust the surface concentration in this region.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of fabricating a semiconductor device on a substrate, the method comprising:

forming a silicon oxide layer on said substrate with said silicon oxide layer having a top surface;

ion implanting a first kind of N-type impurities through said silicon oxide layer into said substrate for N-well regions;

forming and patterning a silicon nitride layer on said top surface of said silicon oxide layer with openings therethrough leaving exposed portions of said top surface;

ion implanting N-type impurities of a second, heavier kind through said openings through said silicon nitride layer and through exposed portions of said top surface of said silicon oxide layer for doping the well regions to form field implant regions adjacent to said silicon nitride layer;

forming a patterned mask over portions of said patterned silicon nitride layer and over portions of said top surface of said silicon oxide layer, said patterned mask having an opening leaving portions of said top surface and said patterned silicon nitride layer exposed which are to be a P-well;

ion implanting P-type impurities through said openings in said patterned mask and exposed portions of said patterned silicon nitride layer and said silicon oxide layer for first P-well regions;

performing a field oxidation process on portions of said substrate unprotected by said silicon nitride layer so that field oxide regions are formed overlying said field implant regions;

stripping said silicon nitride layer; and forming a P-well mask over an N-well region and ion implanting P-type impurities forming second P-well regions in said substrate.

* * * * *